(12) United States Patent
Yoo et al.

(10) Patent No.: US 9,299,817 B2
(45) Date of Patent: Mar. 29, 2016

(54) BIPOLAR JUNCTION TRANSISTOR AND METHOD OF MANUFACTURING THE SAME

(71) Applicant: DONGBU HITEK CO., LTD., Seoul (KR)

(72) Inventors: Jae Hyun Yoo, Bucheon-si (KR); Jong Min Kim, Seoul (KR)

(73) Assignee: Dongbu HiTek Co., Ltd., Seoul (KR)

(*) Notice: Subject to any disclaimer, the term of this patent is extended or adjusted under 35 U.S.C. 154(b) by 0 days.

(21) Appl. No.: 13/832,211

(22) Filed: Mar. 15, 2013

(65) Prior Publication Data
US 2014/0231962 A1 Aug. 21, 2014

(30) Foreign Application Priority Data
Feb. 19, 2013 (KR) .................. 10-2013-0017590

(51) Int. Cl.
*H01L 29/73* (2006.01)
*H01L 29/735* (2006.01)
*H01L 29/66* (2006.01)
*H01L 29/36* (2006.01)
*H01L 29/06* (2006.01)

(52) U.S. Cl.
CPC .......... *H01L 29/735* (2013.01); *H01L 29/0619* (2013.01); *H01L 29/0649* (2013.01); *H01L 29/36* (2013.01); *H01L 29/6625* (2013.01); *H01L 29/0692* (2013.01)

(58) Field of Classification Search
CPC ............ H01L 29/7322; H01L 29/0821; H01L 29/66242; H01L 29/66272; H01L 29/7378
USPC ........... 257/47, 197, 205, 272–273, 370, 378, 257/423, 427, 474, 477, 510–526, 539, 552, 257/555–557, 565–593, E31.039, 257/E27.015–E27.023, E27.03–E27.032, 257/E27.037–E27.043, E27.055, 257/E27.072–E27.078, E29.171, E29.174, 257/E29.182, 560
See application file for complete search history.

(56) References Cited

U.S. PATENT DOCUMENTS

| 5,670,822 | A | * | 9/1997 | Jang | ................... | H01L 27/0623 257/565 |
| 2007/0182478 | A1 | * | 8/2007 | Mun | ........................ | G05F 3/30 327/539 |
| 2012/0094458 | A1 | * | 4/2012 | Cai | ..................... | H01L 27/0705 438/286 |

FOREIGN PATENT DOCUMENTS

| JP | 2011-129944 A | 6/2011 |
| KR | 10-2007-0104834 A | 10/2007 |
| KR | 10-2011-0077889 A | 7/2011 |

OTHER PUBLICATIONS

Notice of Allowance dated Apr. 24, 2014 in Korean Application No. 10-2013-0017590.

*Primary Examiner* — Allen Parker
*Assistant Examiner* — Didarul Mazumder
(74) *Attorney, Agent, or Firm* — Andrew D. Fortney; Central California IP Group P.C.

(57) ABSTRACT

A bipolar junction transistor (BJT) is provided. The BJT can include a semiconductor substrate, a first well disposed in the substrate and implanted with a first impurity, a second well disposed at one side of the first well and implanted with a second impurity, a first device isolation layer disposed in the first well and defining an emitter area, and a second device isolation layer disposed in the second well and defining a collector area. The BJT can also include an emitter having a second impurity, a base having a first impurity, a collector having a second impurity, and a high concentration doping area having a second impurity at high concentration. The high concentration doping area can be provided at one side of the collector in the second well.

19 Claims, 5 Drawing Sheets

BIPOLAR JUNCTION TRANSISTOR AND METHOD OF MANUFACTURING THE SAME

CROSS-REFERENCE TO RELATED APPLICATION

This application claims the benefit under 35 U.S.C. §119 of Korean Patent Application No. 10-2013-0017590, filed Feb. 19, 2013, which is hereby incorporated by reference in its entirety.

BACKGROUND

A bipolar junction transistor (BJT) typically has better current performance and speed than a metal oxide semiconductor (MOS) transistor and thus is widely used in analog, power radio frequency (RF) integrated circuit (IC) designs.

A BJT includes an emitter, a base, and a collector and can be classified as a vertical BJT and a lateral BJT, depending on the direction that charges emitted from the emitter move.

A BJT may be used for an electrostatic discharge protection device for protecting an internal IC.

FIG. 1 is a cross-sectional view of a related art lateral BJT used as an electrostatic discharge protection device. A BJT having an npn structure is shown in FIG. 1.

Referring to FIG. 1, the related art BJT is formed on a p-type semiconductor substrate 11. A first device isolation layer 14, a second device isolation layer 15, and a third isolation layer 16 are formed to distinguish an emitter area, a base area, and a collector area from each other.

A first well 12 is formed by implanting a p-type impurity into the semiconductor substrate 11 at the lower side of the first device isolation layer 14, and a second well 13 is formed by implanting an n-type impurity into the semiconductor substrate 11 at the lower side of the third device isolation layer 16. An area having the first well 12 becomes an emitter and base area, and an area having the second well 13 becomes a collector area.

Also, an n+ emitter 19 is formed by implanting an n-type impurity between the first device isolation layer 14 and the second device isolation layer 15, and a base 17 is formed by implanting a p-type impurity into the other side of the first device isolation layer 14.

Then, a collector 18 is formed at one side of the third device isolation layer 16 by implanting an n-type impurity on the surface of the second well 13.

When such a BJT is used fir an electrostatic discharge protection device, during a circuit design, an input/output (I/O) terminal is configured, a collector is connected to the I/O terminal, an emitter is connected to ground, and a base is connected to ground through resistance.

Such a BJT is used to protect a semiconductor device from electrostatic charge. That is, when an electrostatic voltage of more than 2000 V is applied to the I/O terminal, the BJT discharges the electrostatic current to ground instantly. Accordingly, in order to use a BJT as an electrostatic discharge protection device, parameters such as triggering voltage (Vt), holding voltage (Vh), and breakdown voltage (Vb) need to be satisfied in a range that does not invade an operation area of a core circuit and does not exceed a failure area of a core circuit.

However, a lateral BJT is not as effective as a vertical BJT in terms of electrostatic discharge protection performance.

Thus, a related art method of switching the positions of the emitter 17 and the base 19 is used as shown in FIG. 2. Referring to FIG. 2, when the positions of the emitter 17 and the base 19 are switched, the tunneling effect of a BJT occurs faster, so that this may advance the triggering point.

However, since it is difficult to obtain satisfactory electrostatic discharge protection performance only by switching the positions of an emitter and a base, the size of a BJT may be increased. However, this method also increases the volume resulting from the increased size.

BRIEF SUMMARY

Embodiments of the subject invention provide a bipolar junction transistor (BJT) that can advantageously improve electrostatic discharge protection performance without increasing the size, and a method of manufacturing the same. The structure of a lateral BJT can be changed to provide such an advantageous BJT.

In an embodiment, a BJT can include: a semiconductor substrate; a first well disposed in the substrate and implanted with an impurity of a first type; a second well disposed at one side of the first well and implanted with an impurity of a second type; a first device isolation layer disposed in the first well and defining an emitter area; a second device isolation layer disposed in the second well and defining a collector area; an emitter formed by implanting an impurity of the second type into one side of the first device isolation layer and contacting an electrode; a base formed by implanting an impurity of the first type into the other side of the first device isolation layer opposite of the emitter in the first well and contacting an electrode; a collector formed by implanting an impurity of the second type into one side of the second isolation layer in the second well and contacting an electrode; and a high concentration doping area formed by implanting an impurity of the second type at high concentration into one side of the collector in the second well.

In another embodiment, a method of manufacturing a BJT can include: forming a first well by implanting an impurity of a first type into a semiconductor substrate; forming a second well by implanting an impurity of a second type into the semiconductor substrate; forming a first device isolation layer in the first well; forming a second device isolation layer in the second well; forming an emitter for electrode contact at one side of the first device isolation layer by implanting an impurity of the second type into the semiconductor substrate; forming a collector at one side of the second device isolation layer; and forming a base for electrode contact at one side of the emitter by implanting an impurity of the first type into the semiconductor substrate. The forming of the collector at one side of the second device isolation layer can include forming a high concentration doping area doped with an impurity of the second type at a high concentration, spaced a predetermined interval apart from the collector.

DETAILED DESCRIPTION

Reference will now be made in detail to the embodiments of the present disclosure, examples of which are illustrated in the accompanying drawings.

When the terms "on" or "over" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

Figure 3:
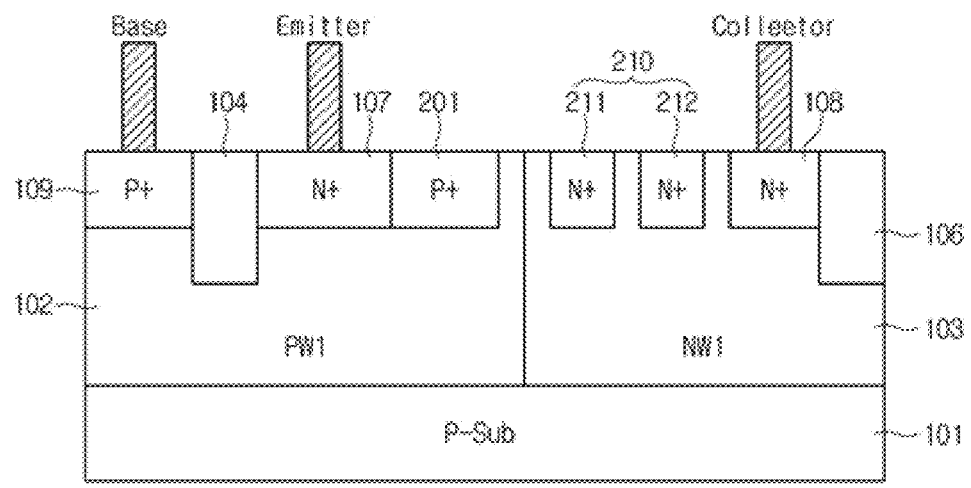
FIG. 3 is a cross-sectional view of a BJT according to an embodiment of the subject invention.
Figure 4:
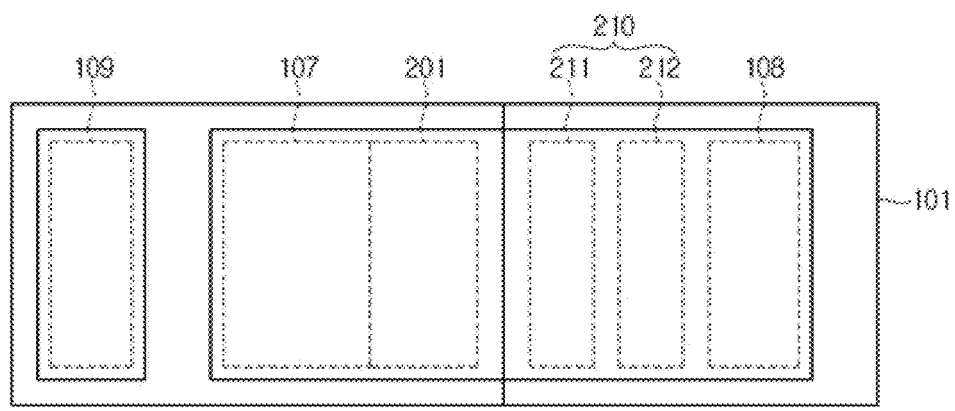
FIG. 4 is a plan view of a BJT according to an embodiment of the subject invention.
Figure 5:
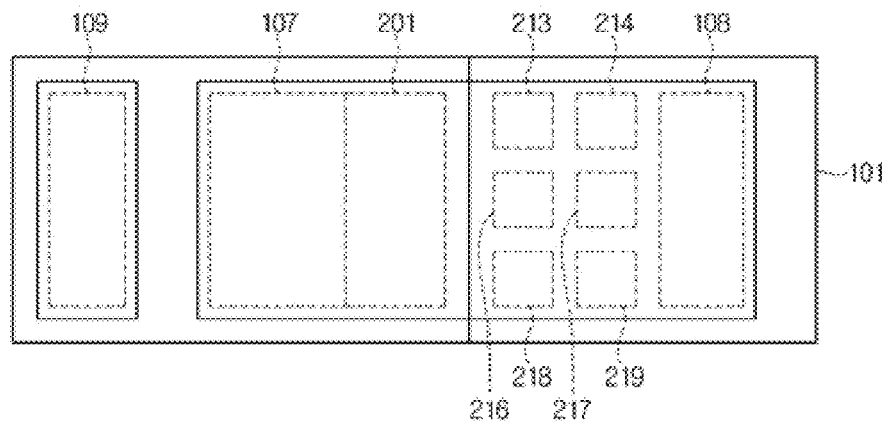
FIG. 5 is a plan view of a BJT according to an embodiment of the subject invention.

FIG. 3 is a cross-sectional view of a bipolar junction transistor (BJT) according to an embodiment of the present invention. FIG. 4 is a plan view of a BJT according to an embodiment of the present invention. Referring to FIG. 4, a pattern of a high concentration doping area can be seen in a collector area. FIG. 5 is a plan view of a BJT according to another embodiment of the present invention. Referring to FIG. 5, another pattern of a high concentration doping area can be seen in a collector area.

Referring to FIG. 3, an npn type BJT is shown. Though an npn type BJT is shown in FIG. 3, embodiments of the subject invention are not limited thereto. An emitter area, a first base area, a second base area, and a collector area can be formed in a semiconductor substrate 101 (e.g., a p-type semiconductor substrate). Though the substrate 101 is depicted as a p-type substrate, embodiments are not limited thereto.

A first well 102 implanted with, for example, a p-type impurity ion can be formed in the substrate 101 so as to form the emitter area, the first base area, and the second base area, and a second well 103 implanted with, for example, an n-type impurity is formed in the substrate 101 so as to form the collector area. Embodiments of the subject invention are not limited thereto. For example, the first 102 and second wells 103 can be implanted with an n-type and p-type impurity, respectively.

Then, a first device isolation layer 104 and a second device isolation layer 106 can be respectively formed in the first well 102 and the second well 103 for device isolation.

The first well 102 can include a first base 109 for base contact and an emitter 107 for emitter contact, with the first device isolation layer 104 provided therebetween. Also, a second base 201 for base area formation, not for base contact, can be formed in the first well 102.

Then, a collector 108 and a high concentration doping area 210 for increasing the maximum electrostatic discharge (ESD) current It2 can be formed at one side of the second device isolation layer 106 in the second well 103.

In more detail, the emitter 107 implanted with an impurity ion (e.g., an n-type impurity ion) can be formed in the emitter area between the first device isolation layer 104 and the second well 103, and the collector 108 implanted with an impurity ion (e.g., an n-type impurity ion) can be formed in the collector area between the first well 102 and the second device isolation layer 106. Also, the first base 109 implanted with an impurity ion (e.g., a p-type impurity ion), can be formed in the first base area that is separated from the emitter area by the first device isolation layer 104. The first base 109 can provide the base contact of a transistor. The second base 201 implanted with an impurity ion (e.g., a p-type impurity ion) can be formed between the emitter area and the second well 103. However, in an embodiment, the second base 201 does not provide base contact.

The high concentration doping area 210 where an impurity ion (e.g., an n-type impurity ion) is implanted at high concentration can be formed in the second well 103 in order to uniformly distribute drain voltage and increase positive feedback and It2. The high concentration doping area 210 can be formed with various patterns according to this embodiment. In an embodiment, a second high concentration doping area 212 can be formed at one side of the collector 108, and a first high concentration doping area 211 can be formed spaced a predetermined distance apart from the second high concentration doping area 212.

The high concentration doping area 210 doped with an impurity (e.g., an n-type impurity) to uniformly distribute drain voltage can be formed with one pattern according to a modified embodiment, or with two patterns as shown in FIG. 3, or with a greater number of patterns.

For example, a pattern shape of the high concentration doping area 210 can be seen in FIG. 4. Viewing the BJT from above, the first and second high concentration doping areas 211 and 212 can be formed with a bar shape having a length similar to that of the collector 108.

Additionally, referring again to FIG. 5, a high concentration doping area at one side of the collector 108 can include at least two doping areas 213, 214, 216, 217, 218, and 219 of a tile pattern. Though a pattern with six tiles is shown, embodiments are not limited thereto. A high concentration doping area with such a tile pattern can be also referred to as a dot type, and at least two high concentration doping areas can be distributed and arranged along the length direction of the collector 108.

A method of manufacturing a BJT according to an embodiment of the present invention will be described as follows.

First, the emitter area, the first base area, the second base area, and the collector area can be defined by forming the first device isolation layer 104 and the second device isolation layer 106 in the semiconductor substrate 101 (e.g., a p-type semiconductor substrate).

Then, the first well 102 can be formed by implanting an impurity ion (e.g., a p-type impurity ion) into the semiconductor substrate 101 including the first device isolation layer 104, the emitter area, and the first and second base areas. The second well 103 can be formed by implanting an impurity ion (e.g., an n-type impurity ion) in the semiconductor substrate 101 including the second device isolation layer 106 and the collector area.

The emitter 107 can be formed by implanting an impurity ion (e.g., an n-type impurity ion) in the emitter area between the first device isolation layer 104 and the second well 103. The collector 108 can be formed by implanting an impurity ion (e.g., an n-type impurity ion) in the collector area between the first well 102 and the second device isolation layer 106.

Additionally, before or after a process for forming the emitter and the collector by implanting an n-type impurity ion is performed, or while a process for forming the emitter and the collector is performed, a process for implanting an impurity (e.g., an n-type impurity) in the drift area of the drain area can be performed. A mask used for implanting a high concentration n-type impurity ion can correspond to the pattern shown in FIG. 4 or 5, though embodiments are not limited thereto. At least one high concentration doping area 210 doped with a high concentration impurity (e.g., an n-type impurity) can be formed at one side of the collector 108.

If the emitter 107 is formed at one side of the first device isolation layer 104, the other side of the first device isolation layer 104 can be called the first base area, and if the first device isolation layer 104 is disposed at one side of the emitter 107, the other side of the emitter can be called the second base area.

In this case, the first base 109 and the second base 201 can be respectively formed by implanting an impurity ion (e.g., a p-type impurity ion) into both sides of the first device isolation layer 104.

Figure 2:
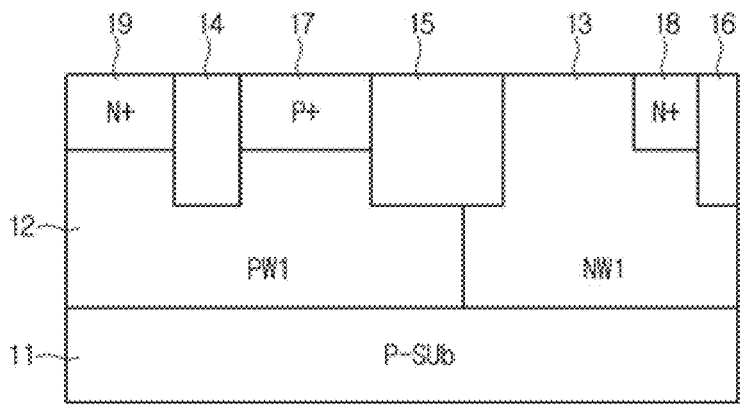
FIG. 2 is a cross-sectional view of a related art BJT used as an electrostatic discharge protection device.

When the BJT according to the first embodiment of the present invention is compared to the related art BJT shown in FIG. 2, the second device isolation layer 15 in the boundary area of the P well 12 and the N well 13 is no longer present, and the base 201 is additionally formed in the second base area of the first well 102.

Figure 1:
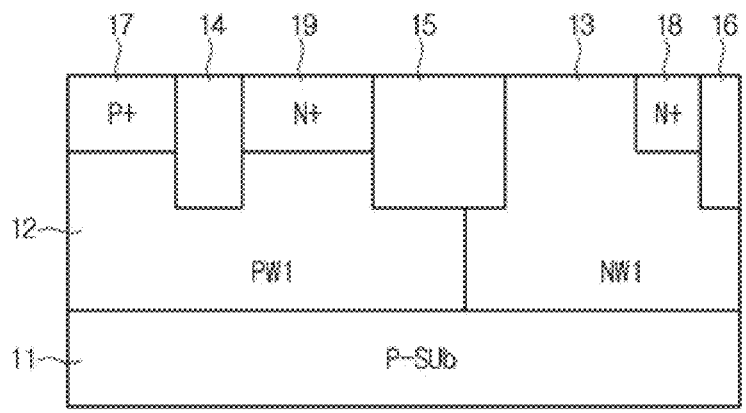
FIG. 1 is a cross-sectional view of a related art lateral bipolar junction transistor (BJT) used as an electrostatic discharge protection device.

When the BJT according to the first embodiment of the present invention is compared to the related art BJT shown in FIG. 1, a tunneling effect occurs faster due to the position change of the emitter 107 and the base 109, so that this may advance the triggering point. Also, since triggering voltage Vt is adjusted with the first well 102, the second well 103, and the base 201, the capability to adjust the triggering voltage Vt is greatly enhanced.

Additionally, base resistance is reduced due to the addition of the base 201, so that sustain voltage Vh is increased.

Moreover, with a structure having no additional base 201, electrons emitted from the emitter 107 crowd the surface of the first well 102 and the second well 103. However, a deep current path can be formed at the bottom due to the addition of the base 201, and due to such a deep current path, sustain voltage Vh can be increased.

Additionally, since the pattern of at least one high concentration doping area 201 at one side collector 108 is disposed in the area of the drain area, the maximum ESD current It2 can be increased.

Figure 6:
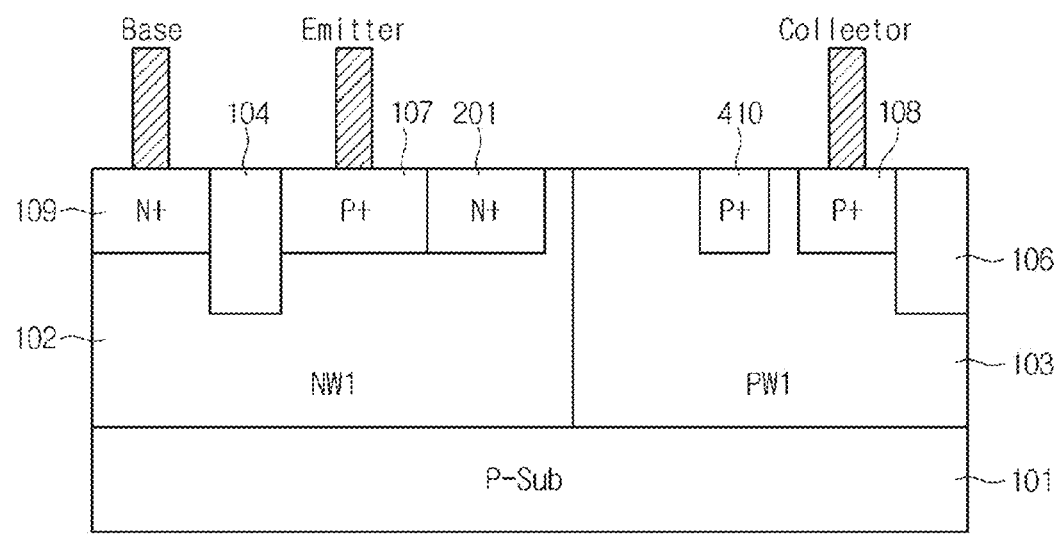
FIG. 6 is a cross-sectional view of a BJT used as an electrostatic discharge protection device according to an embodiment of the subject invention.

FIG. 6 is a cross-sectional view of a BJT available as an electrostatic discharge protection device according to an embodiment of the present invention. That is, while FIG. 3 depicts an npn BJT, FIG. 6 shows a BJT with a pnp structure.

Overlapping descriptions relating to FIGS. 3 to 5 are omitted. A high concentration doping area 410 can be formed at one side of a collector 308 implanted with a p-type impurity and the high concentration doping area 410 can be implanted with a high concentration p-type impurity.

In an embodiment, only one high concentration doping area 410 is formed in the drift area of the drain, but in alternative embodiments, a plurality of high concentration doping areas 410 can be formed. Furthermore, when viewed from above, the pattern shape of the high concentration doping area 410 can also be one bar shape in the length direction of the collector 308, or a plurality of the spaced high concentration doing areas 410 may be disposed, that is, a tile shape (as in FIG. 5).

Figure 7:
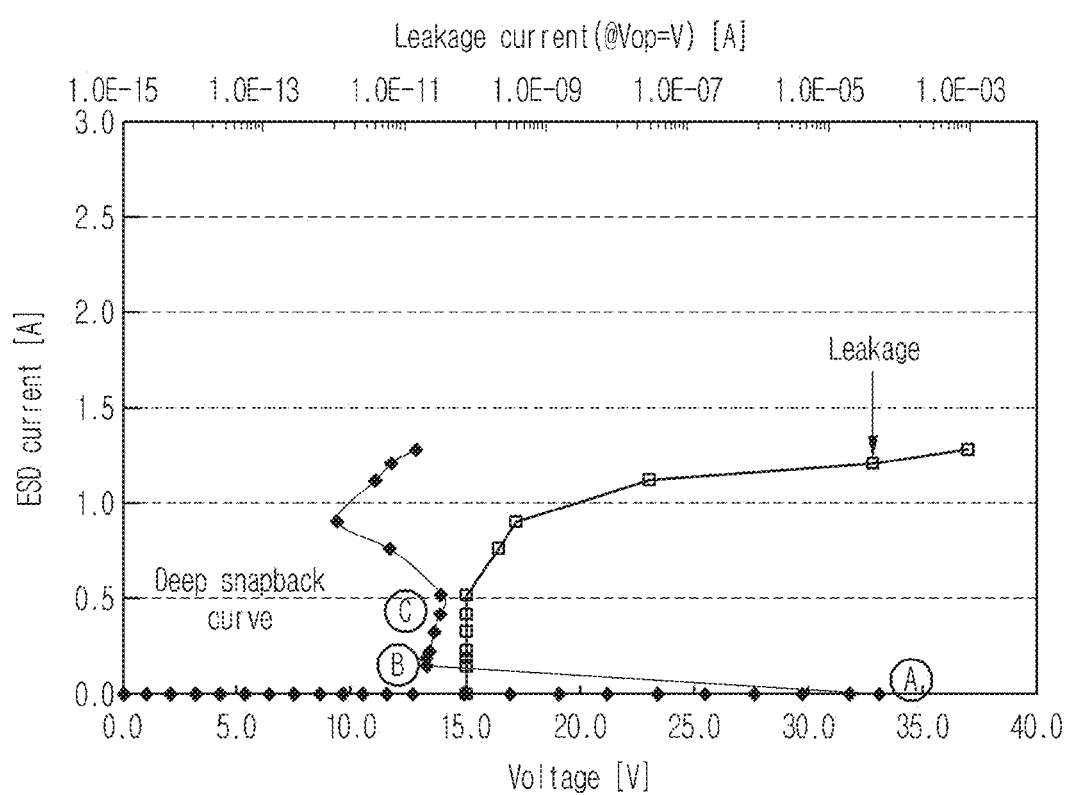
FIGS. 7 and 8 are graphs comparing the performances of a BJT according to an embodiment of the present invention.
Figure 8:
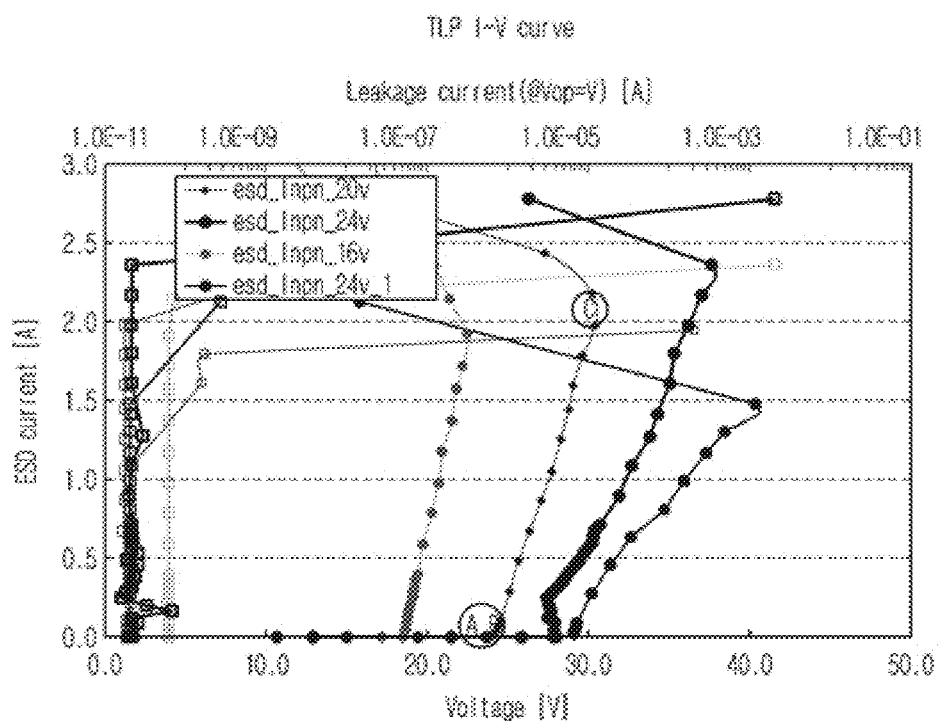

FIGS. 7 and 8 are graphs comparing the performances of BJTs according to embodiments of the present invention.

FIG. 7 is a view of a deep snapback characteristic curve in a related art low dose structure and a transmission line pulse (TLP) curve measured from an LNPN device improved using a structure of an embodiment of the subject invention. Referring to FIG. 7 the ESD current characteristic of a related art NPN structure is shown. A filled line represents an ESD current characteristic according to voltage, and a vacant line represents leakage current according to ESD current. When there is a change in the leakage current, that device is degraded. The point A at the ESD current curve, as a triggering point, may confirm triggering voltage Vt1, and point B, as a first holing point, may confirm holding voltage Vh. The point C, as a second triggering point, may confirm It2. It is confirmed that Vh becomes significantly lower than Vt1, compared to a related art NPN structure. This is due to the deep snapback characteristic, and It2 is also low.

However, when the esd_lnpn_20V curve of FIG. 8 is examined, it shows that Vt1 is identical to Vh, and It2 is about 2.0 V, which is improved four times. Also, Vt1 shows that various devices may be implemented.

In BJTs and methods of manufacturing the same according to embodiments of the present invention, triggering voltage can be easily adjusted, thereby allowing it to be lowered.

Also, sustain voltage can be increased by reducing base resistance, and since a deep current path is formed at the bottom of a base, breakdown voltage can be increased. Accordingly, electrostatic discharge protection performance can be improved without increasing the size of a BJT.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

What is claimed is:

1. A bipolar junction transistor (BJT), comprising:
a semiconductor substrate;
a first well in the substrate and including an impurity of a first type;
a second well at one side of the first well and including an impurity of a second type;
a first device isolation layer in the first well and defining an emitter area;
a second device isolation layer in the second well and defining a collector area;
an emitter comprising an impurity of the second type on one side of the first device isolation layer in the emitter area and contacting a first electrode;
a base comprising an impurity of the first type on another side of the first device isolation layer opposite of the emitter in the first well and contacting a second electrode;
a collector comprising an impurity of the second type on a first side of the second isolation layer in the collector area of the second well and contacting a third electrode; and
at least one patterned high concentration doping area comprising an impurity of the second type at high concentration in the second well, between a first side of the collector and the first well, and spaced apart from the collector by a first portion of the second well.

2. The BJT according to claim 1, wherein the high concentration doping area is apart from the collector by a first predetermined interval, the first predetermined interval including the first portion of the second well.

3. The BJT according to claim 1, wherein the high concentration doping area comprises at least two high concentration doping subareas spaced apart from each other in the second well by a second portion of the second well.

4. The BJT according to claim 1, wherein the high concentration doping area is a single high concentration doping area.

5. The BJT according to claim 1, wherein the first side of the collector is opposite to a second side of the collector adjacent to the second device isolation layer.

6. The BJT according to claim 1, wherein the high concentration doping area has a bar shape and is at a drift area of a drain area.

7. The BJT according to claim 3, wherein the at least two high concentration doping subareas have a tile arrangement, in which the at least two high concentration doping subareas are at a second predetermined interval from each other when viewed from above, the second predetermined interval including the second portion of the second well.

8. The BJT according to claim 1, wherein the first impurity type is a p+ type impurity and the second impurity type is an n+ type impurity.

9. The BJT according to claim 1, wherein the first impurity type is an n+ type impurity and the second impurity type is a p+ type impurity.

10. The BJT according to claim 1, wherein said at least one patterned high concentration doping area comprises a plurality of patterned high concentration doping areas in the second well, spaced apart from each other by the first portion of the second well.

11. The BJT according to claim 10, wherein the plurality of patterned high concentration doping areas is in the second well between the first side of the collector and the first well.

12. The BJT according to claim 10, wherein the plurality of patterned high concentration doping areas comprise an impurity of the second type.

13. The BJT according to claim 7, wherein the tile arrangement comprises six patterned high concentration doping areas, a first subset of which is separated from the collector by the first portion of the second well, and a second subset of which is separated from the first subset by the second portion of the second well.

14. The BJT according to claim 13, wherein the first subset of patterned high concentration doping areas comprises at least three first patterned high concentration tiles along the first side of the collector.

15. The BJT according to claim 14, wherein the second subset of patterned high concentration doping areas comprises at least three second patterned high concentration tiles along the first well.

16. The BJT according to claim 14, wherein the one side of the first device isolation layer comprises a first base area, and the other side of the first device isolation layer comprises a second base.

17. The BJT according to claim 16, wherein the first base area and the second base comprise the first type impurity.

18. The BJT according to claim 1, wherein the collector is in the second well between the second device isolation layer and a first side of the at least one patterned high concentration doping area.

19. The BJT according to claim 18, wherein the collector contacts the first side of the second device isolation layer in the second well.

* * * * *